(12) United States Patent
Uchida et al.

(10) Patent No.: US 8,373,251 B2
(45) Date of Patent: Feb. 12, 2013

(54) SEMICONDUCTOR DEVICE

(75) Inventors: Shinichi Uchida, Kanagawa (JP);
Masayuki Furumiya, Kanagawa (JP);
Hiroshi Sakakibara, Kanagawa (JP);
Takashi Iwadare, Kanagawa (JP);
Yoshiyuki Sato, Kanagawa (JP);
Makoto Eguchi, Aichi (JP); Masato Taki, Aichi (JP); Hidetoshi Morishita, Aichi (JP); Kozo Kato, Aichi (JP); Jun Morimoto, Aichi (JP)

(73) Assignees: Renesas Electronics Corporation, Kanagawa (JP); Toyota Jidosha Kabushiki Kaisha, Toyota-Shi (JP)

( * ) Notice: Subject to any disclaimer, the term of this patent is extended or adjusted under 35 U.S.C. 154(b) by 379 days.

(21) Appl. No.: 12/721,151

(22) Filed: Mar. 10, 2010

(65) Prior Publication Data
US 2010/0230782 A1   Sep. 16, 2010

(30) Foreign Application Priority Data

Mar. 13, 2009   (JP) .................................. 2009-061269

(51) Int. Cl.
*H01L 27/08*   (2006.01)

(52) U.S. Cl. ................ 257/531; 257/773; 257/E29.325; 257/E23.142

(58) Field of Classification Search .................. 257/531, 257/773, 784, 786, E29.325, E23.142
See application file for complete search history.

(56) References Cited

U.S. PATENT DOCUMENTS

| 5,969,590 | A | * | 10/1999 | Gutierrez ...................... 336/200 |
| 7,075,329 | B2 | | 7/2006 | Chen et al. |
| 8,169,108 | B2 | * | 5/2012 | Dupuis et al. ................. 307/109 |

FOREIGN PATENT DOCUMENTS

JP   08-222439   8/1996

* cited by examiner

*Primary Examiner* — Matthew Landau
*Assistant Examiner* — Colleen E Snow
(74) *Attorney, Agent, or Firm* — Young & Thompson

(57) ABSTRACT

A first semiconductor chip includes a first inductor and a second inductor, and a second semiconductor chip includes a third inductor and a fourth inductor. The first inductor is connected to a first receiving circuit of the first semiconductor chip, and the second inductor is connected to a second transmitting circuit of the second semiconductor chip through a first bonding wire. The third inductor is connected to a second receiving circuit of the second semiconductor chip, and the fourth inductor is connected to a first transmitting circuit of the first semiconductor chip through a second bonding wire.

8 Claims, 9 Drawing Sheets

SEMICONDUCTOR DEVICE

This application is based on Japanese patent application No. 2009-061269, the content of which is incorporated hereinto by reference.

BACKGROUND

1. Technical Field

The present invention relates to a semiconductor device capable of transmitting electric signals between two circuits to which the electric signals with different potentials are input.

2. Related Art

When electric signals are transmitted between two circuits to which the electric signals with different potentials are input, photocouplers are generally used. The photocoupler includes a light emitting element, such as a light emitting diode, and a light receiving element, such as a phototransistor. The light emitting element converts an input electric signal into light, and the light receiving element converts the light into the electric signal. In this way, the electric signal is transmitted.

However, since the photocoupler includes the light emitting element and the light receiving element, it is difficult to reduce the size of the photocoupler. When the frequency of the electric signal is high, it is difficult to follow the electric signal. As a technique for solving these problems, for example, U.S. Pat. No. 7,075,329 discloses a structure in which two inductors are formed on the same substrate and the two inductors are inductively coupled to each other to transmit electric signals. In U.S. Pat. No. 7,075,329, when two kinds of electric signals are transmitted, four inductors are formed on the same substrate and two sets of inductors are inductively coupled to each other. Further, in Japanese Published patent application A-H 08-222439 a transformer which is based on square spiral coils formed on semiconductor substrate surface is disclosed. The first coil of the square spiral coils and the second of them have the respective coil patterns almost vertically opposed to catch other with an insulating layer interposed between them and overlapped nearly in the same planer position.

When two kinds of electric signals are transmitted by the inductive coupling between the inductors, two sets of inductors that are inductively coupled to each other are needed. When the distance between two sets of inductors is short, the inductors interfere with each other, and noise is likely to be generated in the electric signal.

SUMMARY

In one embodiment, there is provided a semiconductor device including: a first semiconductor chip; a second semiconductor chip; and first and second bonding wires that connect the first semiconductor chip and the second semiconductor chip. The first semiconductor chip includes a first transmitting circuit and a first receiving circuit that are formed over a first substrate, a first multi-layer interconnect layer that is formed over the first substrate, a first inductor that is provided in the first multi-layer interconnect layer, and a second inductor that is provided in the first multi-layer interconnect layer and is disposed above the first inductor. The second semiconductor chip includes a second transmitting circuit and a second receiving circuit that are formed over a second substrate, a second multi-layer interconnect layer that is formed over the second substrate, a third inductor that is provided in the second multi-layer interconnect layer, and a fourth inductor that is provided in the second multi-layer interconnect layer and is disposed above the third inductor. One of the first inductor and the second inductor is connected to one of the first transmitting circuit and the second transmitting circuit. One of the third inductor and the fourth inductor is connected to the other transmitting circuit of the first transmitting circuit and the second transmitting circuit. In the event that one of the first inductor and the second inductor is connected to the first transmitting circuit, the other inductor of the first inductor and the second inductor is connected to the second receiving circuit. In the event that one of the first inductor and the second inductor is connected to the second transmitting circuit, the other inductor is connected to the first receiving circuit. In the event that one of the third inductor and the fourth inductor is connected to the first transmitting circuit, the other inductor of the third inductor and the fourth inductor is connected to the second receiving circuit. In the event that one of the third inductor and the fourth inductor is connected to the second transmitting circuit, the other inductor is connected to the first receiving circuit.

According to the above-mentioned embodiment of the invention, the first electric signal may be transmitted from one of the first semiconductor chip and the second semiconductor chip to the other semiconductor chip by the inductive coupling between the first inductor and the second inductor, and the second electric signal may be transmitted from the other semiconductor chip to the one semiconductor chip by the inductive coupling between the third inductor and the fourth inductor. The first inductor and the second inductor are formed in the first semiconductor chip, and the third inductor and the fourth inductor are formed in the second semiconductor chip. Therefore, the distance may be increased from the first inductor and the second inductor to the third inductor and the fourth inductor. As a result, the interference may be prevented between the inductive coupling between the first inductor and the second inductor and the inductive coupling between the third inductor and the fourth inductor.

According to the above-mentioned embodiment of the invention, the distance may be increased from the first inductor and the second inductor to the third inductor and the fourth inductor. As a result, the interference may be prevented between the inductive coupling between the first inductor and the second inductor and the inductive coupling between the third inductor and the fourth inductor.

BRIEF DESCRIPTION OF THE DRAWINGS

The above and other objects, advantages and features of the present invention will be more apparent from the following description of certain preferred embodiments taken in conjunction with accompanying drawings, in which.

DETAILED DESCRIPTION

Figure 1:
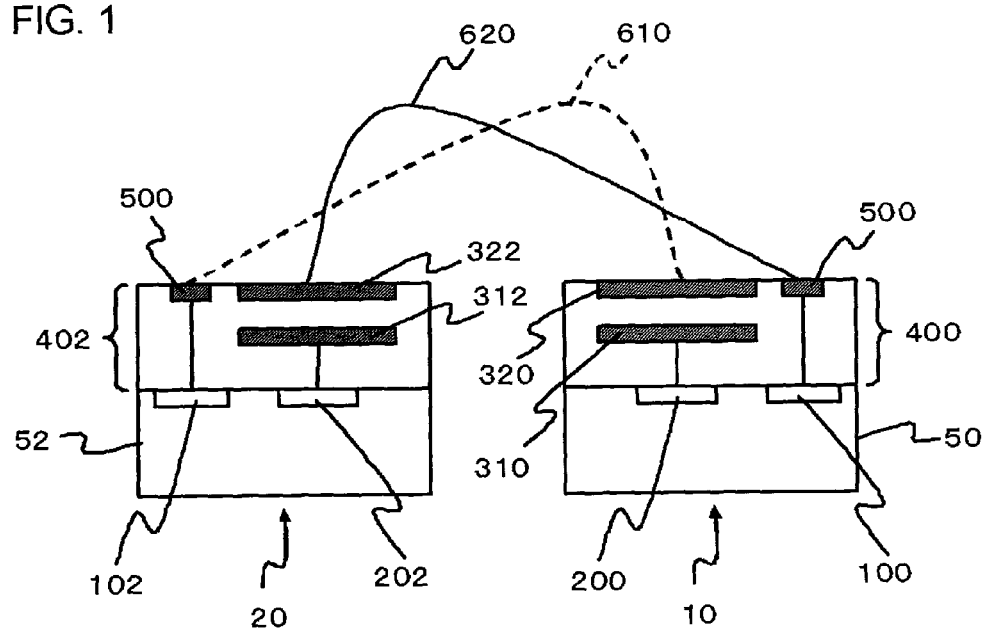
FIG. 1 is a cross-sectional view schematically illustrating the structure of a semiconductor device according to a first embodiment of the invention.

The invention will be now described herein with reference to illustrative embodiments. Those skilled in the art will recognize that many alternative embodiments can be accomplished using the teachings of the present invention and that the invention is not limited to the embodiments illustrated for explanatory purposes.

Hereinafter, embodiments of the invention will be described with reference to the accompanying drawings. In the drawings, the same components are denoted by the same reference numerals and a description thereof will not be repeated.

(First Embodiment)

Figure 2:
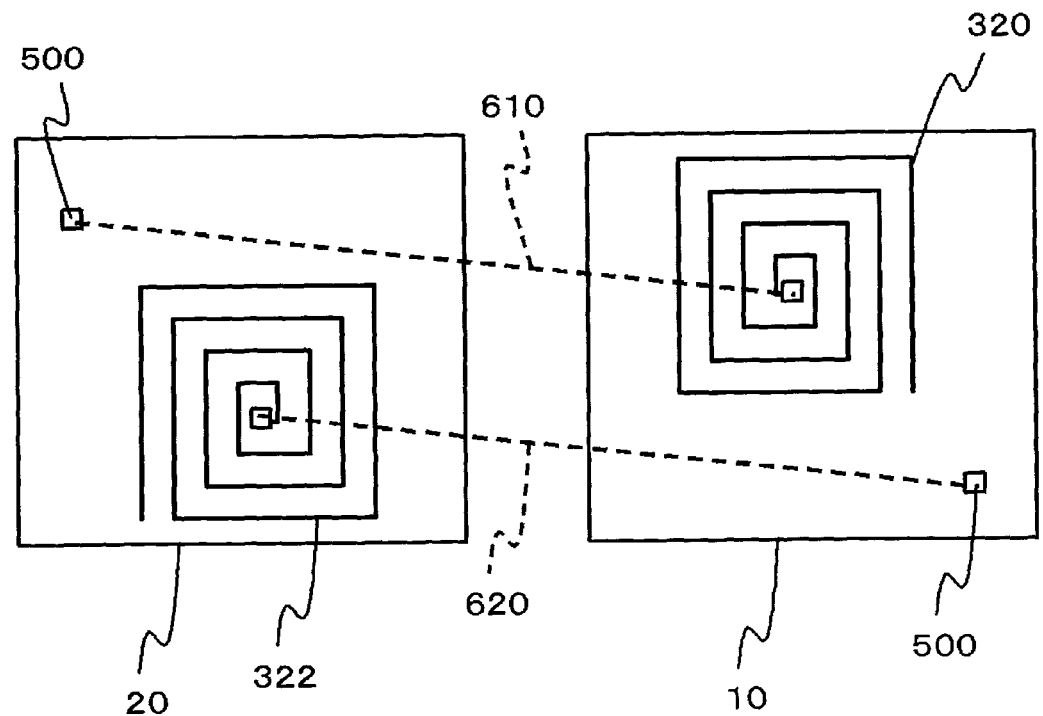
FIG. 2 is a plan view illustrating the semiconductor device shown in FIG. 1.
Figure 3:
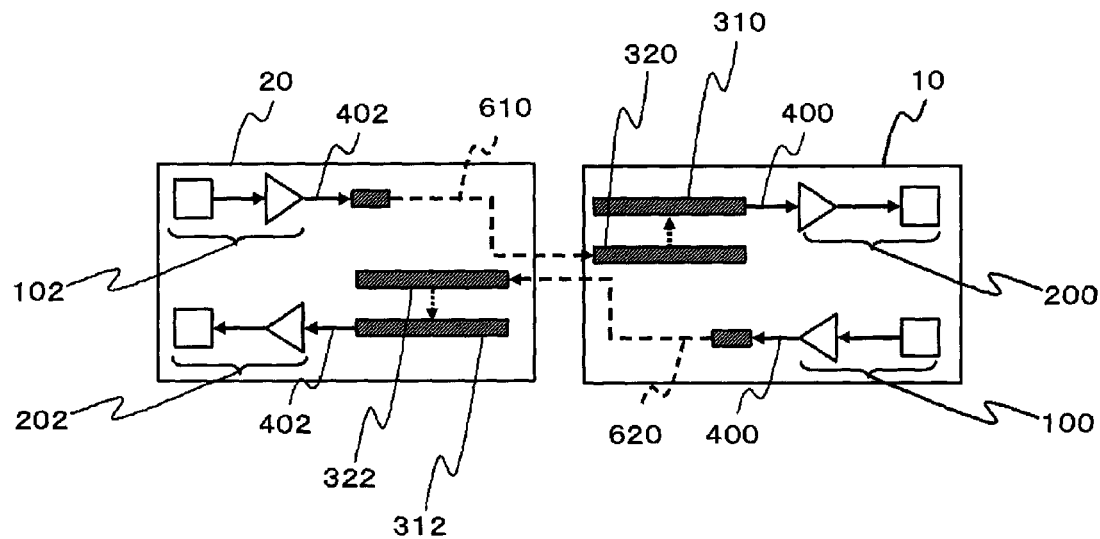
FIG. 3 is a circuit diagram illustrating the semiconductor device shown in FIGS. 1 and 2.

FIG. 1 is a cross-sectional view schematically illustrating the structure of a semiconductor device according to a first embodiment of the invention, and FIG. 2 is a plan view illustrating the semiconductor device shown in FIG. 1. FIG. 3 is a circuit diagram illustrating the semiconductor device shown in FIGS. 1 and 2. The semiconductor device includes a first semiconductor chip 10, a second semiconductor chip 20, a first bonding wire 610, and a second bonding wire 620. The first bonding wire 610 and the second bonding wire 620 connect the first semiconductor chip 10 and the second semiconductor chip 20.

The first semiconductor chip 10 includes a first transmitting circuit 100, a first receiving circuit 200, and a first multi-layer interconnect layer 400. The first transmitting circuit 100 and the first receiving circuit 200 are formed on a first substrate 50. The first multi-layer interconnect layer 400 is formed on the first substrate 50 and has a structure in which insulating layers and interconnect layers are alternately laminated equal to or more than $t_1$ times ($t_1 > 3$) in this order. The first multi-layer interconnect layer 400 includes a first inductor 310 and a second inductor 320. The first inductor 310 is provided in an $n_1$-th interconnect layer of the first multi-layer interconnect layer 400. The second inductor 320 is provided in an $m_1$-th interconnect layer ($t_1 >= m_1 >= n_1 + 2$) of the first multi-layer interconnect layer 400 and is disposed above the first inductor 310.

The second semiconductor chip 20 includes a second transmitting circuit 102, a second receiving circuit 202, and a second multi-layer interconnect layer 402. The second transmitting circuit 102 and the second receiving circuit 202 are formed on a second substrate 52. The second multi-layer interconnect layer 402 is formed on the second substrate 52 and has a structure in which insulating layers and interconnect layers are alternately laminated equal to or more than $t_2$ times ($t_2 > 3$) in this order. The second multi-layer interconnect layer 402 includes a third inductor 312 and a fourth inductor 322. The third inductor 312 is provided in an $n_2$-th interconnect layer of the second multi-layer interconnect layer 402. The fourth inductor 322 is provided in an $m_2$-th interconnect layer ($t_2 >= m_2 >= n_2 + 2$) of the second multi-layer interconnect layer 402, and is disposed above the third inductor 312. In this embodiment, the thicknesses of the layers of the second multi-layer interconnect layer 402 and material s forming the layers are the same as those of the corresponding layers of the first multi-layer interconnect layer 400.

A first electric signal is transmitted from one of the first semiconductor chip 10 and the second semiconductor chip 20 to the other semiconductor chip by inductive coupling between the first inductor 310 and the second inductor 320, and a second electric signal is transmitted from the other semiconductor chip to the one semiconductor chip by inductive coupling between the third inductor 312 and the fourth inductor 322. The first semiconductor chip 10 and the second semiconductor chip 20 process the electric signals with different potentials. The term 'electric signals to be processed with different potentials' means that the electric signals have different reference potentials.

It is preferable that $n_1$ is equal to $n_2$. In this case, it is preferable that $t_1$ is equal to $t_2$ and $m_1$ is equal to $m_2$.

In this embodiment, the inductor disposed above the first inductor 310 is not provided in any interconnect layer between an n-th interconnect layer and an m-th interconnect layer. The first inductor 310 and the second inductor 320 form signal transmitting elements that transmit electric signals therebetween. The electric signal is, for example, a digital signal, but it may be an analog signal.

In this embodiment, each of the first inductor 310, the second inductor 320, the third inductor 312, and the fourth inductor 322 is a spiral interconnect pattern that is formed in the interconnect layer. The insulating layer may be a laminated structure of a plurality of interlayer insulating films or one interlayer insulating film. In this embodiment, the insulating layer has a laminated structure of two interlayer insulating films.

One of the first inductor 310 and the second inductor 320 is connected to one of the first transmitting circuit 100 and the second transmitting circuit 102. One of the third inductor 312 and the fourth inductor 322 is connected to the other transmitting circuit of the first transmitting circuit 100 and the second transmitting circuit 102.

When one of the first inductor 310 and the second inductor 320 is connected to the first transmitting circuit 100, the other inductor of the first inductor 310 and the second inductor 320 is connected to the second receiving circuit 202. When one of the first inductor 310 and the second inductor 320 is connected to the second transmitting circuit 102, the other inductor is connected to the first receiving circuit 200.

When one of the third inductor 312 and the fourth inductor 322 is connected to the first transmitting circuit 100, the other inductor of the third inductor 312 and the fourth inductor 322 is connected to the second receiving circuit 202. When one of the third inductor 312 and the fourth inductor 322 is connected to the second transmitting circuit 102, the other inductor is connected to the first receiving circuit 200.

For example, in the example shown in FIGS. 1 and 3, the first inductor 310 of the first semiconductor chip 10 is connected to the first receiving circuit 200 through the first multi-layer interconnect layer 400. The second inductor 320 of the first semiconductor chip 10 is connected to the second transmitting circuit 102 of the second semiconductor chip 20 through the first bonding wire 610 and the second multi-layer interconnect layer 402 (including an electrode pad 500) of the second semiconductor chip 20. The third inductor 312 of the second semiconductor chip 20 is connected to the second receiving circuit 202 through the second multi-layer interconnect layer 402. The fourth inductor 322 is connected to the first transmitting circuit 100 of the first semiconductor chip 10 through the second bonding wire 620 and the first multi-layer interconnect layer 400 (including the electrode pad 500) of the first semiconductor chip 10.

Figure 4:
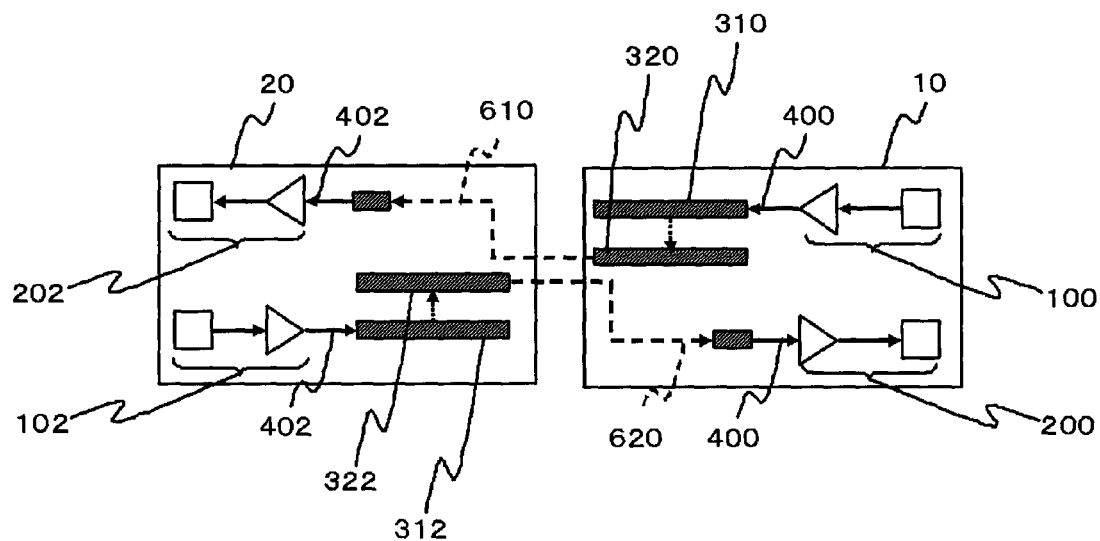
FIG. 4 is a circuit diagram illustrating the structure of a modification of the semiconductor device according to the first embodiment.
Figure 14:
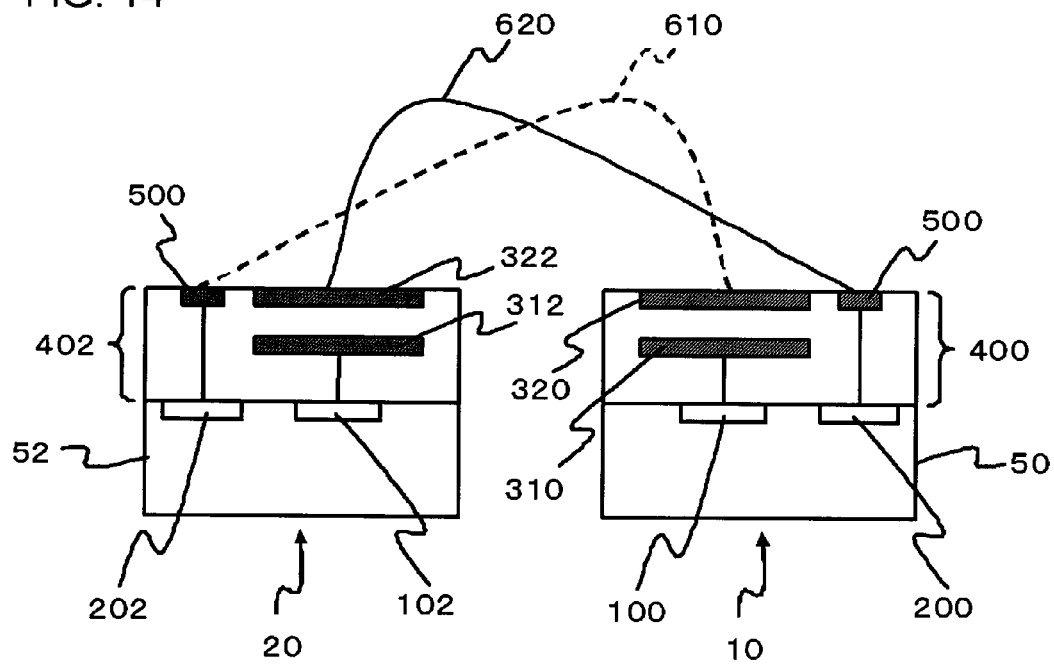
FIG. 14 is a cross-sectional view schematically illustrating the semiconductor device shown in FIG. 4.

As shown in FIGS. 4 and 14, it is also considered that the first inductor 310 is connected to the first transmitting circuit 100 through the first multi-layer interconnect layer 400. In this case, the second inductor 320 is connected to the second receiving circuit 202 through the first bonding wire 610 and the second multi-layer interconnect layer 402. In addition, the third inductor 312 is connected to the second transmitting circuit 102 through the second multi-layer interconnect layer 402, and the fourth inductor 322 is connected to the first receiving circuit 200 through the second bonding wire 620 and the first multi-layer interconnect layer 400.

Figure 5:
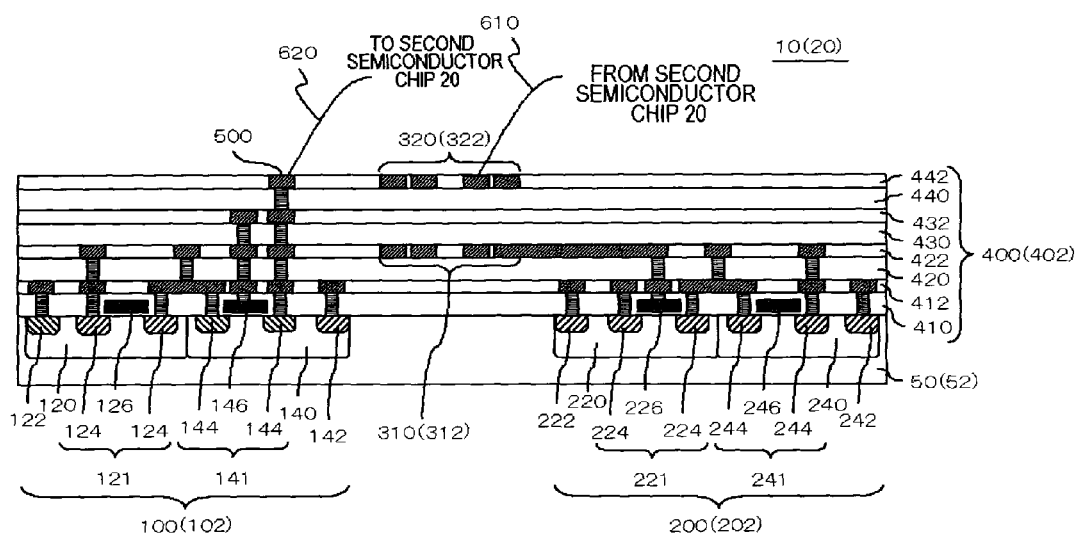
FIG. 5 is a cross-sectional view illustrating the structure of a first semiconductor chip.

FIG. 5 is a cross-sectional view illustrating the structure of the first semiconductor chip 10. The cross section of the second semiconductor chip 20 is the same as that of the first semiconductor chip 10, and thus a description thereof will not be repeated.

In the example shown in FIG. 5, the first semiconductor chip 10 has a laminated structure of four interconnect layers. The interconnects are Cu interconnects formed by a damascene method and are provided in grooves formed in the interconnect layers 412, 422, 432, and 442. The electrode pad 500 is formed in the uppermost interconnect layer. At least one of the four interconnect layers may be an Al alloy interconnect or an Au interconnect. Alternatively, all the interconnects may be Al alloy interconnects or Au interconnects.

An insulating layer 410 for forming a contact plug is formed between the first substrate 50 and the lowermost interconnect layer. In addition, insulating layers 420, 430, and 440 for forming vias are provided between the first interconnect layer and the second interconnect layer, between the second interconnect layer and the third interconnect layer, and between the third interconnect layer and the fourth interconnect layer, respectively. The insulating layer 410, the interconnect layer 412, the insulating layer 420, the interconnect layer 422, the insulating layer 430, the interconnect layer 432, the insulating layer 440, and the interconnect layer 442 are laminated in this order on the first substrate 50.

The insulating films forming the insulating layers and the interconnect layers may be $SiO_2$ films or low-dielectric-constant films. The low-dielectric constant films may be insulating films having, for example, equal to or less than 3.3 of dielectric constant, or preferably, equal to or less than 2.9 of that. The low-dielectric-constant film may be made of, for example, polyhydrogen siloxane, such as hydrogen silsesquioxane (HSQ), methyl silsesquioxane (MSQ) or methylated hydrogen silsesquioxane (MHSQ), an organic material containing an aromatic compound, such as polyallyl ether (PAE), divinyl-siloxane-bis-benzocyclobutene (BCB), or Silk (registered trademark), SOG, FOX (flowable oxide) (registered trademark), Cytop (registered trademark), or benzocyclobutene (BCB), in addition to SiOC. In addition, the low-dielectric-constant film may be a porous film of any of these materials.

The first inductor 310 is positioned in the second interconnect layer 422 from the lower side, and the second inductor 320 is positioned in the uppermost interconnect layer 442. The interconnect layer 432 and two insulating layers 430 and 440 are disposed between the first inductor 310 and the second inductor 320.

The first substrate 50 is a first-conduction-type (for example, p-type) semiconductor substrate. The first substrate 50 may be a silicon on insulator (SOI) substrate, a SiC substrate, or a compound semiconductor substrate, such as a GaAs substrate or a GaN substrate. The first semiconductor chip 10 includes the first transmitting circuit 100 and the first receiving circuit 200. In the example shown in FIG. 5, the first receiving circuit 200 is connected to the first inductor 310, and the first transmitting circuit 100 is connected to the fourth inductor 322 of the second semiconductor chip 20 through the electrode pad 500 and the second bonding wire 620.

The first transmitting circuit 100 includes first transistors. The first transistors include a first-conduction-type transistor and a second-conduction-type transistor. A first-conduction-type first transistor 121 is formed in a second-conduction-type well 120, and includes two first-conduction-type impurity regions 124 which will be a source and a drain, and a gate electrode 126. A second-conduction-type first transistor 141 is formed in a first-conduction-type well 140 and includes two second-conduction-type impurity regions 144 which will be a source and a drain, and a gate electrode 146. A gate insulating film is provided below each of the gate electrodes 126 and 146. The two gate insulating films have substantially the same thickness.

A second-conduction-type impurity region 122 is formed in the second-conduction-type well 120, and a first-conduction-type impurity region 142 is formed in the first-conduction-type well 140. An interconnect for applying the reference potential (ground potential) of the first-conduction-type first transistor 121 is connected to the impurity region 122, and an interconnect for applying the reference potential of the second-conduction-type first transistor 141 is connected to the impurity region 142.

The first receiving circuit 200 includes second transistors. The second transistors include a first-conduction-type transistor and a second-conduction-type transistor. A first-conduction-type second transistor 221 is formed in a second-conduction-type well 220, and includes two first-conduction-type impurity regions 224 which will be a source and a drain, and a gate electrode 226. A second-conduction-type second transistor 241 is formed in a first-conduction-type well 240, and includes two second-conduction-type impurity regions 244 which will be a source and a drain, and a gate electrode 246. A gate insulating film is provided below each of the gate electrodes 226 and 246. In the example shown in FIG. 5, the two gate insulating films are substantially the same as the gate insulating films of the first transistors 121 and 141 included in the first transmitting circuit 100. However, the first transistors 121 and 141 and the second transistors 221 and 241 may include gate insulating films with different thicknesses.

A second-conduction-type impurity region 222 is formed in the second-conduction-type well 220, and a second-conduction-type impurity region 242 is formed in the first-conduction-type well 240. An interconnect for applying the reference potential of the first-conduction-type second transistor 221 is connected to the impurity region 222, and an interconnect for applying the reference potential of the second-conduction-type second transistor 241 is connected to the impurity region 242.

Next, a method of manufacturing the semiconductor device according to this embodiment will be described. First, the first transistors 121 and 141 and the second transistors 221 and 241 are formed on a wafer-shaped substrate. Then, the multi-layer interconnect layer (the first multi-layer interconnect layer 400 and the second multi-layer interconnect layer 402) is formed on the first transistors 121 and 141 and the second transistors 221 and 241. When the multi-layer interconnect layer is formed, the first inductor 310 (or the third inductor 312), the second inductor 320 (or the fourth inductor 322), and the electrode pad 500 are formed. Then, the wafer-shaped substrate is divided into semiconductor chips. In this way, the first semiconductor chip 10 and the second semiconductor chip 20 are formed by the same process.

Then, the first semiconductor chip 10 and the second semiconductor chip 20 are connected to each other by the first bonding wire 610 and the second bonding wire 620. In this way, a semiconductor device is manufactured.

Next, the effects and operation of this embodiment will be described. In this embodiment, the first electric signal is transmitted from one of the first semiconductor chip 10 and the second semiconductor chip 20 to the other semiconductor chip through inductive coupling between the first inductor 310 and the second inductor 320, and the second electric signal is transmitted from the other semiconductor chip to the one semiconductor chip by inductive coupling between the third inductor 312 and the fourth inductor 322. The first inductor 310 and the second inductor 320 are formed in the first semiconductor chip 10, and the third inductor 312 and the fourth inductor 322 are formed in the second semiconductor chip 20. Therefore, it is possible to increase the distance from the first inductor 310 and the second inductor 320 to the third inductor 312 and the fourth inductor 322. As a result, it is possible to prevent noise from being generated in the first and second electric signals due to the interference between the inductive coupling between the first inductor 310 and the second inductor 320 and the inductive coupling between the third inductor 312 and the fourth inductor 322.

In addition, $n_1$ is equal to $n_2$, that is, the distance from the first inductor 310 to the first substrate 50 is substantially equal to the distance from the third inductor 312 to the second substrate 52. Therefore, the parasitic capacitance formed between the first inductor 310 and the first substrate 50 is substantially equal to the parasitic capacitance formed between the third inductor 312 and the second substrate 52. Since both the first inductor 310 and the third inductor 312 that are disposed in the relatively lower layer are connected to a receiving circuit (or a transmitting circuit), the potential of the first inductor 310 and the third inductor 312 is equal to that of the receiving circuit (or the transmitting circuit). When the potentials are equal to each other, charge and discharge do not occur, and capacitance, that is, parasitic capacitance is not formed. Therefore, when the semiconductor device circuit is designed, the parasitic capacitance is not considered. This effect is particularly remarkable when the first semiconductor chip 10 and the second semiconductor chip 20 manufactured by the same manufacturing process are divided from a wafer.

(Second Embodiment)

Figure 6:
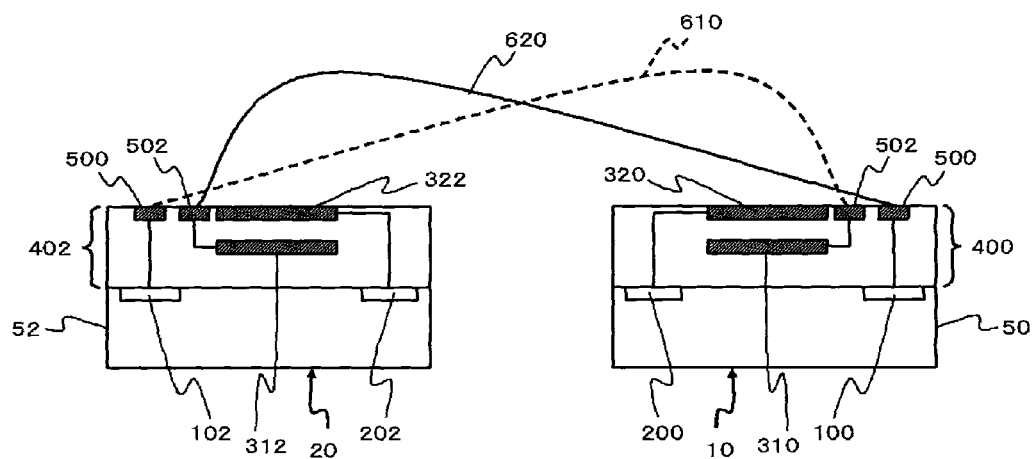
FIG. 6 is a cross-sectional view schematically illustrating the structure of a semiconductor device according to a second embodiment of the invention.
Figure 7:
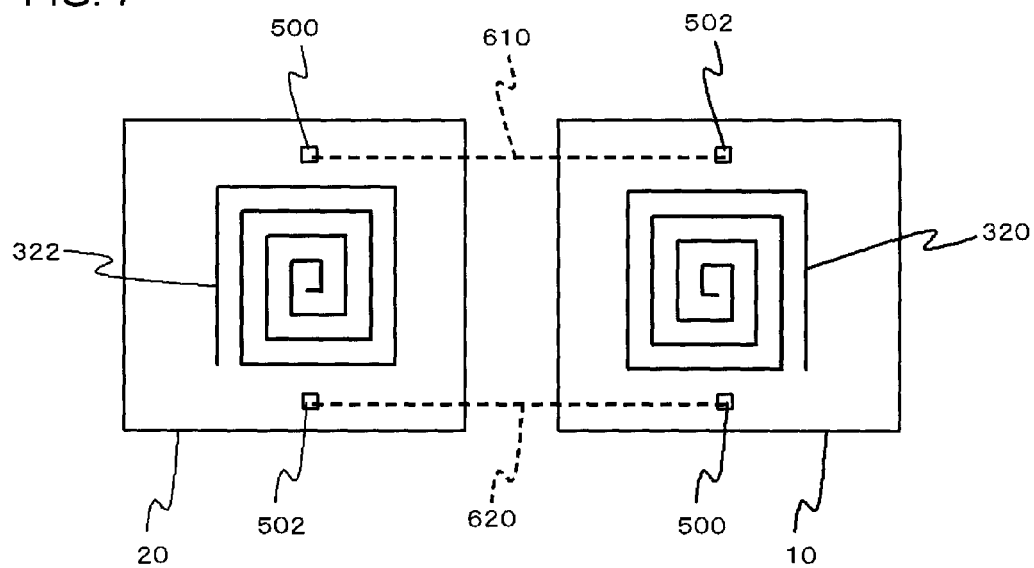
FIG. 7 is a plan view illustrating the semiconductor device shown in FIG. 6.
Figure 8:
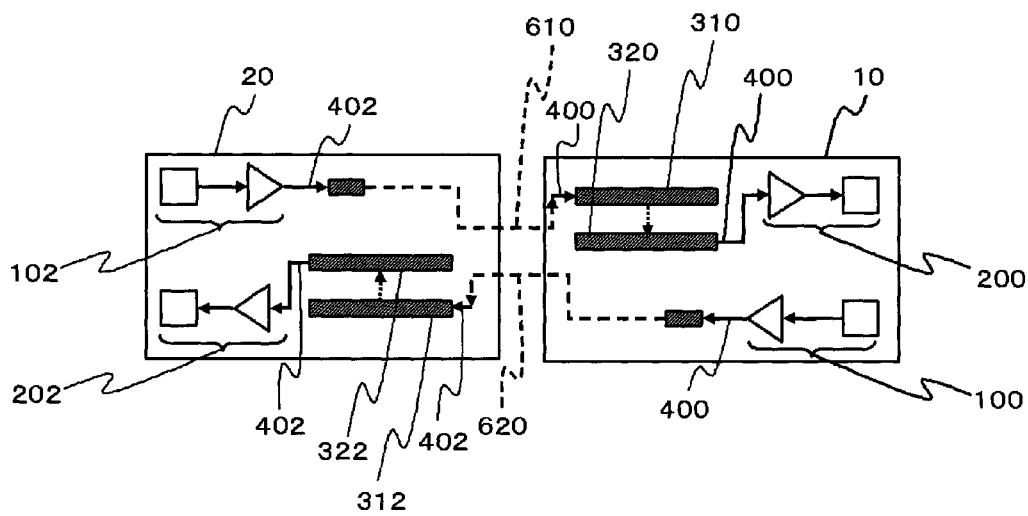
FIG. 8 is a circuit diagram illustrating the semiconductor device shown in FIG. 6.
Figure 9:
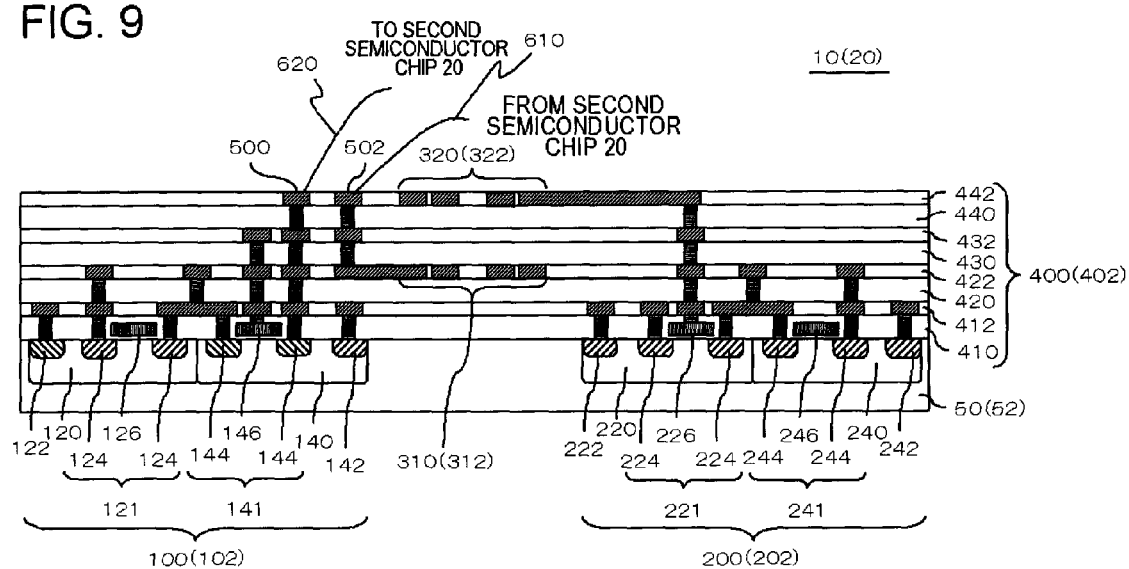
FIG. 9 is a cross-sectional view illustrating a first semiconductor chip used in the semiconductor device shown in FIG. 6.

FIG. 6 is a cross-sectional view schematically illustrating the structure of a semiconductor device according to a second embodiment, and FIG. 7 is a plan view illustrating the semiconductor device shown in FIG. 6. FIG. 8 is a circuit diagram illustrating the semiconductor device shown in FIG. 6, and FIG. 9 is a cross-sectional view illustrating a first semiconductor chip 10 used in the semiconductor device shown in FIG. 6. FIGS. 6, 7, 8, and 9 correspond to FIGS. 1, 2, 3, and 5 in the first embodiment, respectively. The cross-sectional view of a second semiconductor chip 20 is the same as that of the first semiconductor chip 10. The structure of the semiconductor device according to the second embodiment is the same as that of the semiconductor device according to the first embodiment except that the lower inductors 310 and 312 are connected to a circuit of another semiconductor chip by the bonding wires 610 and 620.

The first inductor 310 is connected to the second transmitting circuit 102 of the second semiconductor chip 20 through the first multi-layer interconnect layer 400 (including an electrode pad 502), the first bonding wire 610, and the second multi-layer interconnect layer 402 (including the electrode pad 500) of the second semiconductor chip 20. The second inductor 320 is connected to the first receiving circuit 200 through the first multi-layer interconnect layer 400.

The third inductor 312 is connected to the first transmitting circuit 100 of the first semiconductor chip 10 through the second multi-layer interconnect layer 402 (including the electrode pad 502), the second bonding wire 620, and the first multi-layer interconnect layer 400 (including the electrode pad 500) of the first semiconductor chip 10. The fourth inductor 322 is connected to the second receiving circuit 202 through the second multi-layer interconnect layer 402.

Figure 10:
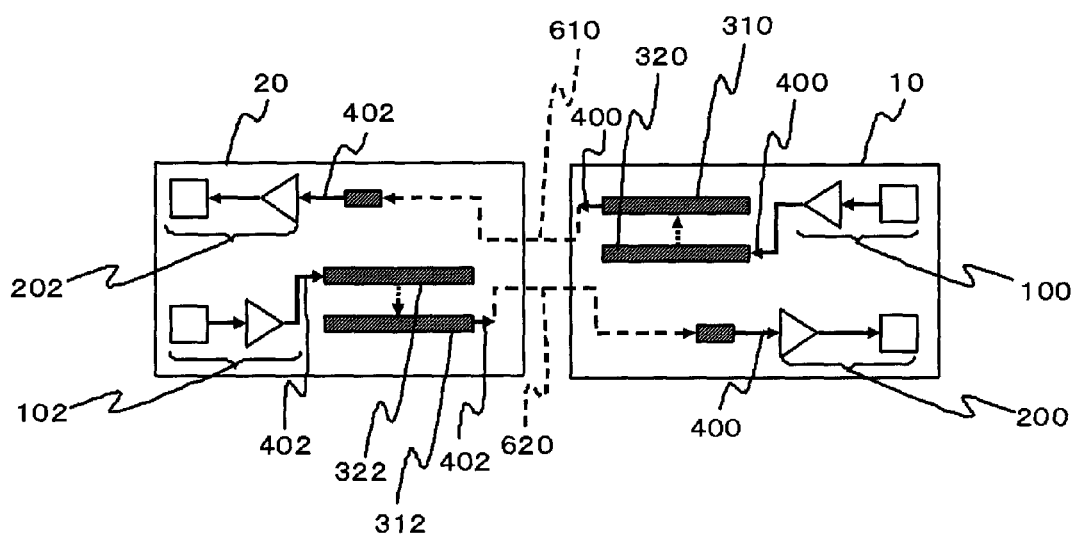
FIG. 10 is a circuit diagram illustrating the structure of a modification of the semiconductor device according to the second embodiment.
Figure 15:
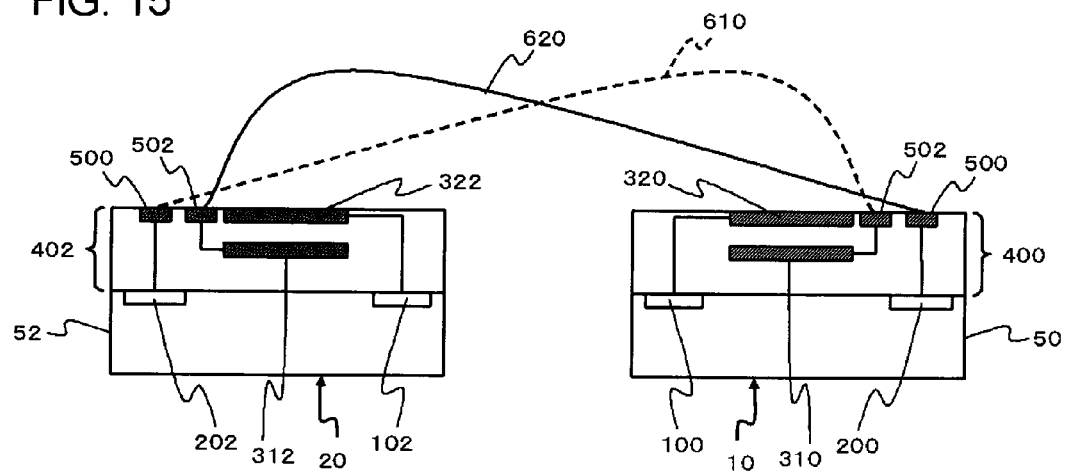
FIG. 15 is a cross-sectional view schematically illustrating the semiconductor device shown in FIG. 10.

As shown in FIGS. 10 and 15, the first inductor 310 may be connected to the second receiving circuit 202 of the second semiconductor chip 20 through the first multi-layer interconnect layer 400 (including the electrode pad 502), the first bonding wire 610, and the second multi-layer interconnect layer 402 (including the electrode pad 500) of the second semiconductor chip 20. In this case, the second inductor 320 is connected to the first transmitting circuit 100 through the first multi-layer interconnect layer 400. The third inductor 312 is connected to the first receiving circuit 200 of the first semiconductor chip 10 through the second multi-layer interconnect layer 402 (including the electrode pad 502), the second bonding wire 620, and the first multi-layer interconnect layer 400 (including the electrode pad 500) of the first semiconductor chip 10. The fourth inductor 322 is connected to the second transmitting circuit 102 through the second multi-layer interconnect layer 402.

According to this embodiment, it is also possible to obtain the same effects as those in the first embodiment.

(Third Embodiment)

Figure 11:
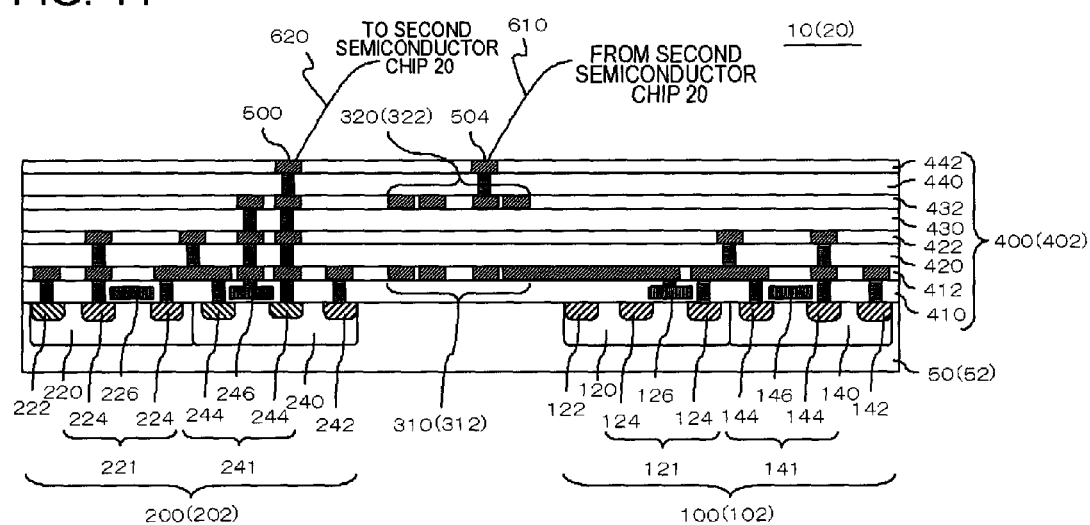
FIG. 11 is a cross-sectional view schematically illustrating the structure of a semiconductor device according to a third embodiment of the invention.

FIG. 11 is a cross-sectional view illustrating the structure of a semiconductor device according to a third embodiment, and corresponds to FIG. 5 in the first embodiment. The structure of the semiconductor device according to this embodiment is the same as that of the first embodiment except that, in the first semiconductor chip 10 and the second semiconductor chip 20, the second inductor 320 and the fourth inductor 322 are formed in the interconnect layer 432 immediately below the uppermost layer and are connected to the first bonding wire 610 through an electrode pad 504 formed in the uppermost layer.

In this embodiment, it is also possible to obtain the same effects as those in the first embodiment.

(Fourth Embodiment)

Figure 12:
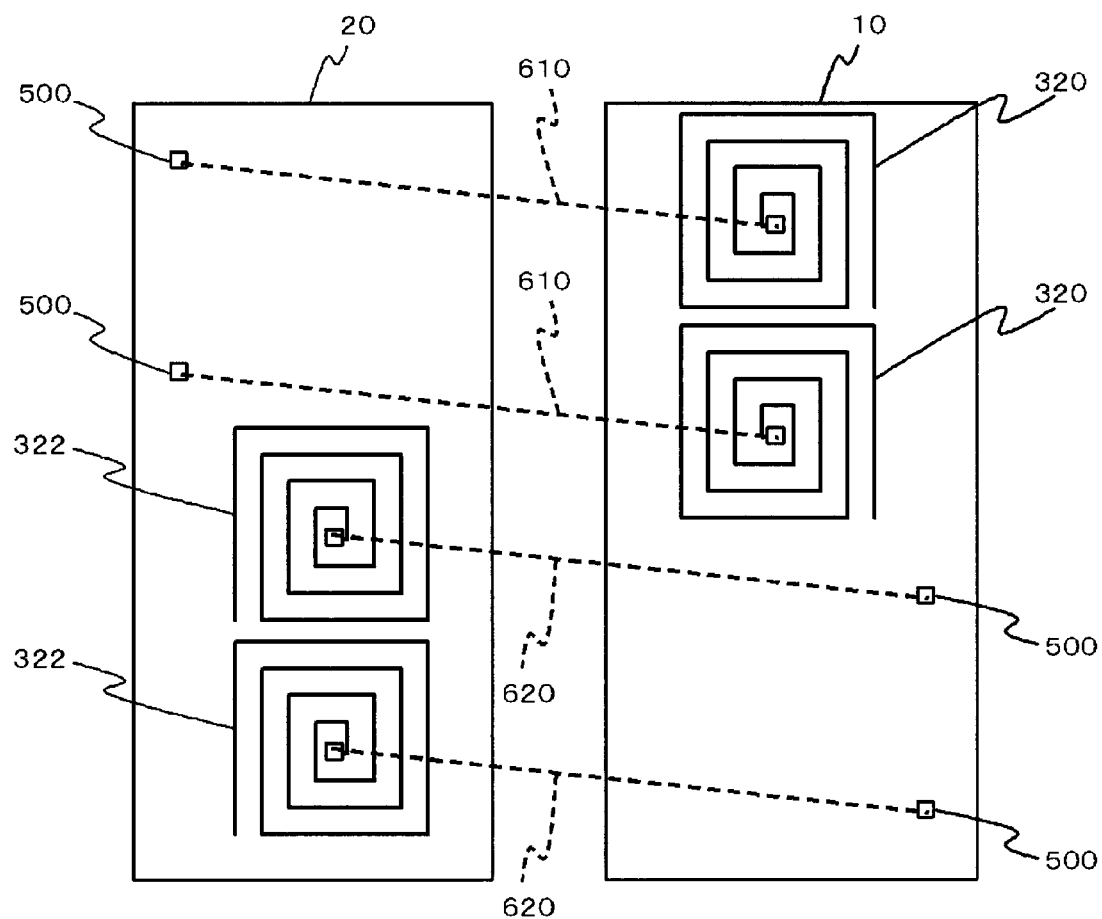
FIG. 12 is a plan view schematically illustrating the structure of a semiconductor device according to a fourth embodiment of the invention.
Figure 13:
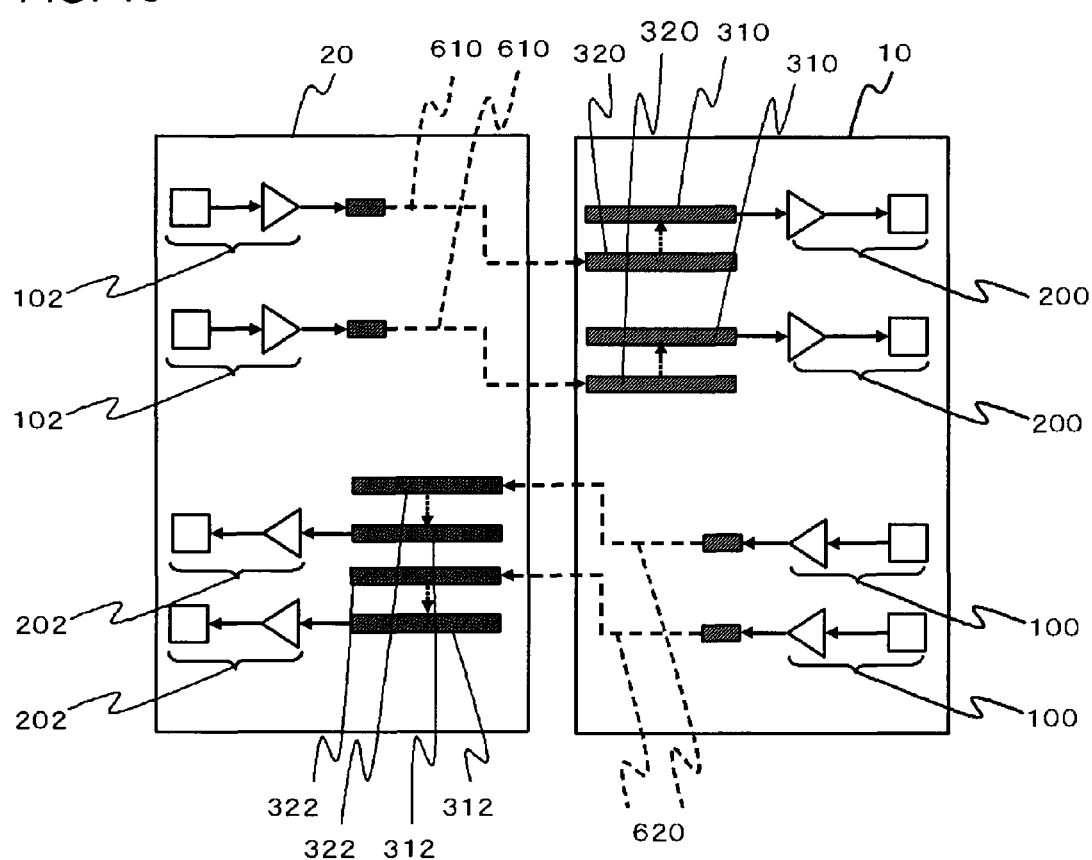
FIG. 13 is a circuit diagram illustrating the semiconductor device shown in FIG. 12.

FIG. 12 is a plan view illustrating the structure of a semiconductor device according to a fourth embodiment, and FIG. 13 is a circuit diagram illustrating the semiconductor device shown in FIG. 12. The semiconductor device according to this embodiment is the same as the semiconductor device according to the first embodiment except that each semiconductor chip includes an even number of inductor pairs that transmit electric signals with opposite phases.

The first semiconductor chip 10 includes a plurality of first inductors 310 and a plurality of second inductors 320. The number of first inductors 310 is equal to that of second inductors 320. The second semiconductor chip 20 includes third inductors 312 and fourth inductors 322. Each of the number of third inductors 312 and the number of fourth inductors 322 is equal to the number of first inductors 310. Each of the number of first bonding wires 610 and the number of second bonding wires 620 is equal to the number of first inductors 310. In this embodiment, an even number of first inductors 310, an even number of second inductors 320, an even number of third inductors 312, and an even number of fourth inductors 322 are provided.

The second transmitting circuit 102 connected to a second inductor 320 and the second transmitting circuit 102 connected to another second inductor 320 which is disposed adjacent to the second inductor 320 form a differential circuit. That is, the phase of the electric signal input to the second inductor 320 and the first inductor 310 is opposite to that of the electric signal input to a second inductor 320, another second inductor 320 disposed adjacent to the first inductor 310, and the first inductor 310.

The first transmitting circuit 100 connected to a fourth inductor 322 and the first transmitting circuit 100 connected to another fourth inductor 322 which is disposed adjacent to the fourth inductor 322 form a differential circuit. That is, the phase of the electric signal input to a fourth inductor 322 and a third inductor 312 is opposite to that of the electric signal input to another fourth inductor 322 and another third inductor 312 which are disposed adjacent to the fourth inductor 322 and the third inductor 312.

In this embodiment, it is also possible to obtain the same effects as those in the first embodiment. In addition, the phase of the electric signal input to a second inductor 320 and a first inductor 310 is opposite to that of the electric signal input to another second inductor 320 and another first inductor 310 which are disposed adjacent to the second inductor 320 and the first inductor 310. Therefore, when a pair of the second inductors 320 and the first inductors 310 is inductively coupled, adjacent pairs of conductors strengthen the magnetic field. Therefore, it is possible to prevent noise from being generated in the electric signal.

The phase of the electric signal input to a fourth inductor 322 and a third inductor 312 is opposite to that of the electric signal input to another fourth inductor 322 and another third inductor 312 which are disposed adjacent to the fourth inductor 322 and the third inductor 312. Therefore, when a pair of the fourth inductors 322 and the third inductors 312 is inductively coupled, adjacent pairs of inductors strengthen the magnetic field. Therefore, it is possible to prevent noise from being generated in the electric signal.

The embodiments of the invention have been described above, which are examples of the present invention. Various structures other than the above-mentioned structures may be used.

It is apparent that the present invention is not limited to the above embodiment, but may be modified and changed without departing from the scope and spirit of the invention.

What is claimed is:

1. A semiconductor device comprising:
   a first semiconductor chip;
   a second semiconductor chip; and
   first and second bonding wires that connect said first semiconductor chip and said second semiconductor chip,
   wherein said first semiconductor chip includes:
      a first transmitting circuit and a first receiving circuit that are formed over a first substrate;
      a first multi-layer interconnect layer that is formed over said first substrate;
      a first inductor that is provided in said first multi-layer interconnect layer; and
      a second inductor that is provided in said first multi-layer interconnect layer and is disposed above said first inductor,
   and said second semiconductor chip includes:
      a second transmitting circuit and a second receiving circuit that are formed over a second substrate;
      a second multi-layer interconnect layer that is formed over said second substrate;
      a third inductor that is provided in said second multi-layer interconnect layer; and
      a fourth inductor that is provided in said second multi-layer interconnect layer and is disposed above said third inductor,
   wherein one of said first inductor and said second inductor is connected to one of said first transmitting circuit and said second transmitting circuit,
   wherein one of said third inductor and said fourth inductor is connected to the other transmitting circuit of said first transmitting circuit and said second transmitting circuit,
   wherein, in the event that one of said first inductor and said second inductor is connected to said first transmitting circuit, the other inductor of said first inductor and said second inductor is connected to said second receiving circuit,
   wherein, in the event that one of said first inductor and said second inductor is connected to said second transmitting circuit, the other inductor is connected to said first receiving circuit,
   wherein, in the event that one of said third inductor and said fourth inductor is connected to said first transmitting circuit, the other inductor of said third inductor and said fourth inductor is connected to said second receiving circuit, and
   wherein, in the event that one of said third inductor and said fourth inductor is connected to said second transmitting circuit, the other inductor is connected to said first receiving circuit.

2. The semiconductor device according to claim 1,
   wherein said first inductor is connected to said first transmitting circuit through said first multi-layer interconnect layer,
   said second inductor is connected to said second receiving circuit through said first bonding wire and said second multi-layer interconnect layer,
   said third inductor is connected to said second transmitting circuit through said second multi-layer interconnect layer, and
   said fourth inductor is connected to said first receiving circuit through said second bonding wire and said first multi-layer interconnect layer.

3. The semiconductor device according to claim 2,
   wherein said first inductor is formed in an $n_1$-th interconnect layer of said first multi-layer interconnect layer, and
   said third inductor is formed in an $n_2$-th interconnect layer of said second multi-layer interconnect layer (where $n_1=n_2$).

4. The semiconductor device according to claim 3,
   wherein said first semiconductor chip and said second semiconductor chip are divided from the wafer manufactured by the same manufacturing process.

5. The semiconductor device according to claim 1,
   wherein said first inductor is connected to said first receiving circuit through said first multi-layer interconnect layer,
   said second inductor is connected to said second transmitting circuit through said first bonding wire and said second multi-layer interconnect layer, said third inductor is connected to said second receiving circuit through said second multi-layer interconnect layer, and said fourth inductor is connected to said first transmitting circuit through said second bonding wire and said first multi-layer interconnect layer.

6. The semiconductor device according to claim 1,
wherein said first semiconductor chip includes a plurality of first inductors and a plurality of second inductors, and the number of first inductors is equal to the number of second inductors, said second semiconductor chip includes a plurality of third inductors and a plurality of fourth inductors, and each of the number of third inductors and the number of fourth inductors is equal to the number of first inductors, and each of the number of first bonding wires and the number of second bonding wires is equal to the number of first inductors.

7. The semiconductor device according to claim 6,
wherein the phase of an electric signal input to one of said first inductors is opposite to that of an electric signal input to another first inductor which is disposed adjacent to said one first inductor, and the phase of an electric signal input to one of said third inductors is opposite to that of an electric signal input to another third inductor which is disposed adjacent to said one third inductor.

8. The semiconductor device according to claim 1,
wherein said first multi-layer interconnect layer is formed by alternately laminating insulating layers and interconnect layers equal to or more than $t_1$ time ($t_1 > 3$) in this order, said first inductor is provided in said $n_1$-th interconnect layer of said first multi-layer interconnect layer, said second inductor is provided in an $m_1$-th interconnect layer of said first multi-layer interconnect layer ($t_1 >= m_1 >= n_1 + 2$), said second multi-layer interconnect layer is formed by alternately laminating insulating layers and interconnect layers equal to or more than $t_2$ time ($t_2 > 3$) in this order, said first inductor is provided in said $n_2$-th interconnect layer of said second multi-layer interconnect layer, and said second inductor equal to is provided in an $m_2$-th interconnect layer of said second multi-layer interconnect layer ($t_2 >= m_2 >= n_2 + 2$).

* * * * *